(12) United States Patent
Liu et al.

(10) Patent No.: US 12,482,767 B2
(45) Date of Patent: Nov. 25, 2025

(54) INTEGRATED PACKAGE ELECTRONIC DEVICE STRUCTURE

(71) Applicant: DYNAX SEMICONDUCTOR, INC., Kunshan (CN)

(72) Inventors: Xin Liu, Kunshan (CN); Shuyu Yan, Kunshan (CN)

(73) Assignee: DYNAX SEMICONDUCTOR, INC., Kunshan (CN)

( * ) Notice: Subject to any disclaimer, the term of this patent is extended or adjusted under 35 U.S.C. 154(b) by 318 days.

(21) Appl. No.: 17/637,364

(22) PCT Filed: Aug. 21, 2020

(86) PCT No.: PCT/CN2020/110470
§ 371 (c)(1),
(2) Date: Feb. 22, 2022

(87) PCT Pub. No.: WO2021/032189
PCT Pub. Date: Feb. 25, 2021

(65) Prior Publication Data
US 2022/0293536 A1 Sep. 15, 2022

(30) Foreign Application Priority Data
Aug. 22, 2019 (CN) .......................... 201910779583.5

(51) Int. Cl.
*H01L 23/66* (2006.01)
*H01L 25/16* (2023.01)
*H01L 23/00* (2006.01)

(52) U.S. Cl.
CPC .............. *H01L 23/66* (2013.01); *H01L 25/16* (2013.01); *H01L 24/48* (2013.01);
(Continued)

(58) Field of Classification Search
CPC . H01L 27/02; H01L 27/0288; H01L 27/0292; H01L 2924/1421;
(Continued)

(56) References Cited

U.S. PATENT DOCUMENTS 11,233,014 B2 * 1/2022 Chen ........................ H01L 23/50
11,258,356 B2 * 2/2022 Liu .......................... H02M 1/14
(Continued)

FOREIGN PATENT DOCUMENTS

CN        101847627 A    9/2010
CN        103269208 A    8/2013
(Continued)

OTHER PUBLICATIONS

PCT International Search Report and Written Opinion, Application No. PCT/CN2020/110470, dated Nov. 27, 2020, 16 pages: with English translation.
(Continued)

*Primary Examiner* — Marlon T Fletcher
*Assistant Examiner* — Christina A Sylvia
(74) *Attorney, Agent, or Firm* — Armstrong Teasdale LLP

(57) ABSTRACT

An embodiment of the present disclosure provides a new integrated package electronic device structure, including a packaging component, including a packaging frame and a packaging substrate, and at least two circuit modules, being packaged on one side of the packaging substrate within the packaging frame, wherein the packaging frame including a merge point for the at least two circuit modules. In the present disclosure, by setting the merge points of at least two circuits packaged within the packaging frame on the packaging frame, the problem of occupying a large area when the integrated electronic device is applied due to setting the merge points on the packaging substrate is avoided, the utilization rate of the integrated electronic device is
(Continued)

improved, and the integration and industrialization of the electronic device is facilitated.

9 Claims, 4 Drawing Sheets

(52) U.S. Cl.
CPC . *H01L 2223/6611* (2013.01); *H01L 2223/665* (2013.01); *H01L 2223/6655* (2013.01); *H01L 2223/6672* (2013.01); *H01L 2223/6688* (2013.01); *H01L 2224/48195* (2013.01); *H01L 2924/1421* (2013.01)

(58) Field of Classification Search
CPC . H01L 2924/19011; H01L 2224/48195; H01L 2224/48153; H01L 2224/48091; H01L 2224/49113; H01L 2223/6611; H01L 2223/665; H01L 2223/6655; H01L 2223/6672; H01L 2223/6688; H01L 2223/6644; H01L 24/48; H01L 24/49; H01L 25/16; H01L 25/18; H01L 23/66; H01L 23/49833; H01L 23/49844; H01L 23/495; H01L 23/4952; H01L 23/04
See application file for complete search history.

(56) References Cited

U.S. PATENT DOCUMENTS

| | | | |
|---|---|---|---|
| 2002/0020894 A1 | 2/2002 | Nishijima | |
| 2009/0322430 A1* | 12/2009 | Romero | H03F 1/0288 |
| | | | 257/773 |
| 2011/0001587 A1* | 1/2011 | Sutardja | H01L 25/18 |
| | | | 257/734 |
| 2014/0073087 A1* | 3/2014 | Huang | H01L 21/56 |
| | | | 438/107 |
| 2021/0203278 A1* | 7/2021 | Wei | H01L 24/49 |

FOREIGN PATENT DOCUMENTS

| | | | | |
|---|---|---|---|---|
| CN | 104979333 A | 10/2015 | | |
| CN | 105789163 A | 7/2016 | | |
| CN | 210866177 U | 6/2020 | | |
| EP | 3247038 A1 * | 11/2017 | ....... | H01L 23/49838 |

OTHER PUBLICATIONS

China First Office Action, Application No. 201910779583.5, 9 pps.: with English translation.

* cited by examiner

INTEGRATED PACKAGE ELECTRONIC DEVICE STRUCTURE

CROSS REFERENCE TO RELATED APPLICATIONS

This patent application is a National Stage Entry of PCT/CN2020/110470 filed on Aug. 21, 2020, which claims the benefit and priority of Chinese Patent Application No. 201910779583.5 filed on Aug. 22, 2019, the disclosures of which are incorporated by reference herein in their entirety as part of the present application.

BACKGROUND

The present disclosure belongs to the field of integrated electronic devices, and particularly relates to a new integrated package electronic device structure.

Power amplifiers are an important component of wireless communication systems. Power amplifiers are used to amplify the input signal and then output it. In the process of power amplifier performing amplification function, the power amplifier converts DC energy into RF energy.

At present, the power amplifier module is difficult to integrate with other modules, and most of the power amplifier modules are connected into the whole system in the form of separate modules, which makes the power amplifier module will occupy a larger room of the whole wireless communication system, which is not conducive to the miniaturization of the whole wireless communication system. In addition, the grounding of the traditional surface mount power supply circuit needs to be implemented on a PCB board and a long bias line is introduced to connect to the DC power supply, and the filter circuit on the PCB board can be grounded only through a chip capacitor, etc. This approach not only occupies a larger PCB area, causes waste of resources and space, reduces the integration level in integrated circuit applications, but also greatly limits the application fields of power amplifiers.

BRIEF DESCRIPTION

In view of the above, embodiments of the present disclosure provide an integrated package electronic device structure, to achieve grounding function setting on the package electronic device structure, which not only avoids the problem of occupying a large area in the application of the integrated electronic device caused by setting a long bias line on the printed circuit board and mounting a larger capacitor to achieve the grounding function, but also helps to reduce the size of the power amplifier module and improve the integration level of the power amplifier application circuit. The integrated package device structure of the disclosure can be widely used in the application of radio frequency grounding circuits, improve traditional surface mount circuits, and greatly improve the application integration level of current radio frequency power amplifiers, and it also lays a solid foundation for the miniaturization and lightweight of portable intelligent electronic products.

The present disclosure provides an integrated package electronic device structure, including a packaging component, including a packaging frame and a packaging substrate, and at least two circuit modules, being packaged on one side of the packaging substrate within the packaging frame, wherein the packaging frame includes a merge point for the at least two circuit modules.

Further, the integrated package electronic device structure further includes an integrated passive device area, being packaged on one side of the packaging substrate within the packaging frame, wherein the at least two circuit modules are located in the integrated passive device area, and at least two connection circuits are formed between the integrated passive device area and the packaging frame.

Further, the at least two circuit modules include a matching circuit module and a grounding circuit module, the matching circuit module and the grounding circuit module being electrically connected to the packaging frame, respectively, wherein one end of the grounding circuit is electrically connected to the packaging frame via a resonant inductor Ls, and one end of the matching circuit module is electrically connected to the packaging frame via a radio frequency choke RFC.

Further, the grounding circuit module includes an integrated capacitor Cs, and the integrated capacitor Cs and the resonant inductor Ls are electrically connected and form a series resonant circuit.

Further, the other end of the grounding circuit module is at equal potential with the packaging substrate.

Further, the grounding circuit module further includes a tuning inductor L2, the tuning inductor L2 is connected in series with the integrated capacitor Cs, and the integrated capacitor Cs, the tuning inductor Ls2, and the resonant inductor Ls form a series resonant circuit.

Further, an inductance value of the radio frequency choke RFC is greater than an inductance value of the resonant inductor Ls.

Further, the integrated package electronic device structure further includes an active device area packaged within the packaging frame, the active device area being electrically connected to the integrated passive device area.

Further, the other end of the matching circuit module is connected to a load circuit.

Further, the packaging frame includes at least one pad, the matching circuit module and the grounding circuit module being electrically connected to the pads, respectively, and the pad electrically connected to the matching circuit module and the pad electrically connected to the grounding circuit module are connected to the same fixed voltage.

Further, the other end of the radio frequency choke RFC electrically connected to the matching circuit module and the other end of the resonant inductor Ls electrically connected to the grounding circuit module are electrically connected.

In the integrated package electronic device structure provided by embodiments of the present disclosure, by setting the merge points of at least two circuits packaged within the packaging frame on the packaging frame, the problem of occupying a large area when the integrated electronic device is applied due to setting the merge points on the packaging substrate is avoided, the utilization rate of the integrated electronic device is improved, and the integration and industrialization of the electronic device is facilitated.

Thus, in the integrated package electronic device provided by embodiments of the present disclosure, by packaging the integrated passive device area including the matching circuit module and the grounding circuit module within the packaging component, the matching circuit module and the grounding circuit module being electrically connected to the packaging frame at the same time, and connected to the same external voltage via the radio frequency choke RFC and the resonant inductor Ls respectively, the other end of the grounding circuit module is at equal potential with the packaging substrate, and the direct grounding function setting is achieved on the integrated package electronic device, thus avoiding the problem of occupying a large area when the integrated electronic device is applied, which is caused by setting a longer bias line on the printed circuit board and attaching a larger capacitor to achieve the grounding function. Furthermore, by setting the integrated capacitor Cs and the tuning inductor Ls2 within the grounding circuit module, the integrated capacitor Cs of the grounding circuit is connected to an inductor at each of both ends to achieve the circuit adjustment flexibility of the package device structure, which allows the grounding circuit to be tuned according to requirements of different frequencies, improving the utilization rate of the integrated device and reducing the development time and costs.

BRIEF DESCRIPTION OF THE DRAWINGS

In order to describe the technical solutions in the embodiments of the present disclosure or the background art more clearly, the following will briefly introduce the drawings that need to be used in the description of the embodiments or the background art. Obviously, the drawings in the following description are schematic diagrams of some embodiments of the present disclosure. Those of ordinary skill in the art can also obtain other solutions based on these drawings without making inventive labor.

DETAILED DESCRIPTION

Figure 1:
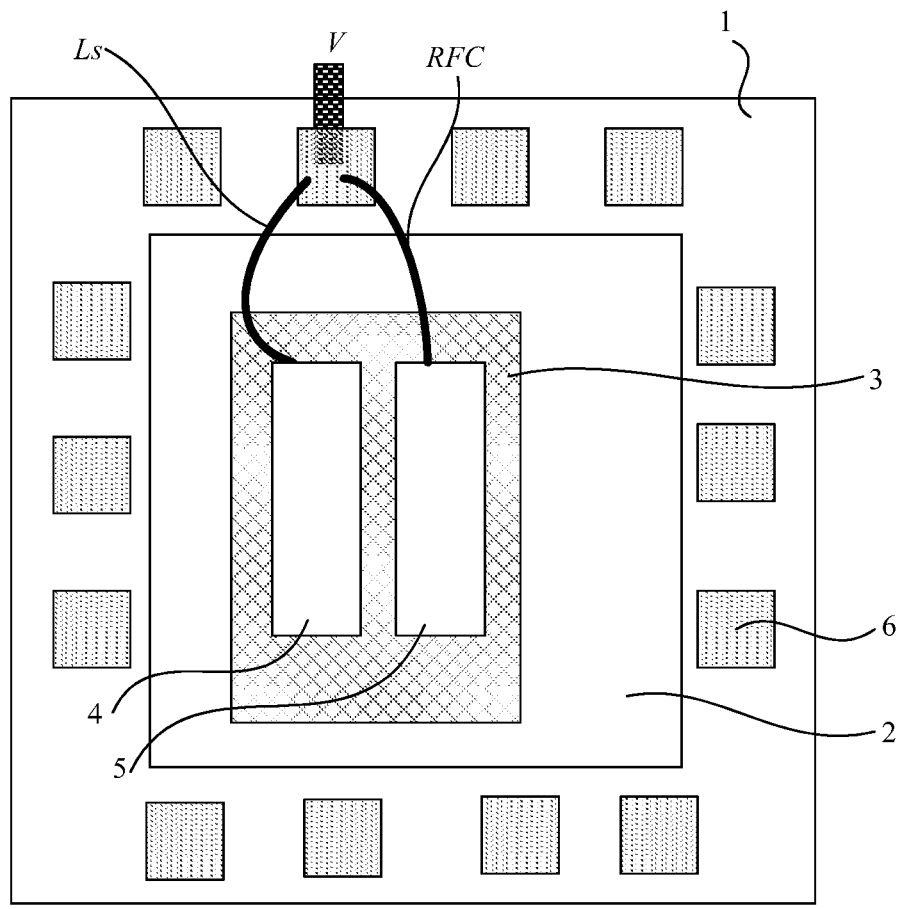
FIG. 1 is a schematic diagram of the structure of an integrated package electronic device provided by an embodiment of the present disclosure.

The present disclosure will be described in greater detail below with reference to the accompanying drawings and embodiments. It should be appreciated that the specific embodiments described herein are merely illustrative rather than limiting the present disclosure. In addition, it should be noted that, in order to facilitate illustration, the drawings only show a part but not all of the structure related to the present disclosure. Throughout this description, the same or similar reference numerals represent the same or similar structures, elements or processes. It should be noted that the embodiments and the features in the embodiments in the present application can be combined with each other if there is no conflict.

Embodiments of the present disclosure provide an integrated package electronic device structure, including a packaging component, including a packaging frame and a packaging substrate, and at least two circuit modules, being packaged on one side of the packaging substrate within the packaging frame, wherein the packaging frame includes a merge point for the at least two circuit modules.

The integrated package electronic device structure provided by the embodiments of the present disclosure further includes an integrated passive device area, being packaged on one side of the packaging substrate within the packaging frame, wherein the at least two circuit modules are located in the integrated passive device area, and at least two connection circuits are formed between the integrated passive device area and the packaging frame.

In the integrated package electronic device structure provided by embodiments of the present disclosure, by setting the merge points of at least two circuits packaged within the packaging frame on the packaging frame, the problem of occupying a large area when the integrated electronic device is applied due to setting the merge points on the packaging substrate is avoided, the utilization rate of the integrated electronic device is improved, and the integration and industrialization of the electronic device is facilitated.

Thus, in the integrated package electronic device structure provided by embodiments of the present disclosure, by packaging the integrated passive device area including the matching circuit module and the grounding circuit module within the packaging component, and at least two connection circuits being formed between the integrated passive device area and the packaging frame, by electrically connecting the matching circuit module and the grounding circuit module to the packaging frame respectively, the direct grounding function setting is achieved on the integrated package electronic device, thus avoiding the problem of occupying a large area when the integrated electronic device is applied, which is caused by setting a longer bias line on the printed circuit board and attaching a larger capacitor to achieve the grounding function. Furthermore, by setting the integrated capacitor Cs and the tuning inductor Ls2 within the grounding circuit module, the circuit adjustment flexibility of the package device structure is achieved, which allows the grounding circuit to be tuned according to requirements of different frequencies, improving the utilization rate of the integrated device and reducing the development time and costs.

The above is the core idea of the present disclosure. The technical solutions in the embodiments of the present disclosure will be clearly and completely described below in conjunction with the drawings in the embodiments of the present disclosure. Based on the embodiments of the present disclosure, all other embodiments obtained by those of ordinary skill in the art without making inventive labor shall fall within the protection scope of the present disclosure.

FIG. 1 is a schematic diagram of the structure of an integrated package electronic device provided by an embodiment of the present disclosure. As shown in FIG. 1, the integrated package electronic device structure includes a packaging component which includes a packaging frame 1 and a packaging substrate 2, and a merge point for the at least two circuit modules packaged on one side of the packaging substrate within the packaging frame is located on the packaging frame, which means, the packaging frame 1 includes at least one merge point connected to the circuit within the packaging frame 1. Specifically, an integrated passive device area 3 is packaged on one side of the packaging substrate 2 within the range of the packaging frame 1, and at least two connection circuits are formed between the integrated passive device area 3 and the packaging frame 1, which means, the merge point of the packaging frame 1 is connected to at least two circuits. The integrated passive device area 3 includes at least two circuit modules, such as a matching circuit module 5 and a grounding circuit module 4. The matching circuit module 5 and the grounding circuit module 4 in this embodiment are electrically connected to the pad 6 of the packaging frame 1, respectively, which means, the merge point of the matching circuit module 5 and the grounding circuit module 4 is formed on a pad 6 of the packaging frame 1.

Specifically, one end of the grounding circuit module 4 is electrically connected to the packaging frame 1 through a resonant inductor Ls, and one end of the matching circuit module 5 is electrically connected to the packaging frame 1 through a radio frequency choke RFC. In this embodiment, the packaging frame 1 includes at least one pad 6, the devices packaged within the integrated passive device area 3 are electrically connected to the pad 6, and at least two connection circuits are formed between the integrated passive device area 3 and the packaging frame 1, wherein an electrical connection is formed between the matching circuit module 5 and the pad 6, and an electrical connection is formed between the grounding circuit module 4 and the pad 6, respectively, specifically, one end of the matching circuit module 5 is electrically connected to the pad 6 through a radio frequency choke RFC, and one end of the grounding circuit module 4 is electrically connected to the pad 6 through a resonant inductor Ls. In this embodiment, the pads connected to the matching circuit module 5 and the pads connected to the grounding circuit module 4 are connected to the same fixed voltage to obtain the same external DC voltage U to ensure stable power supply of the integrated passive device area 3.

Figure 2:
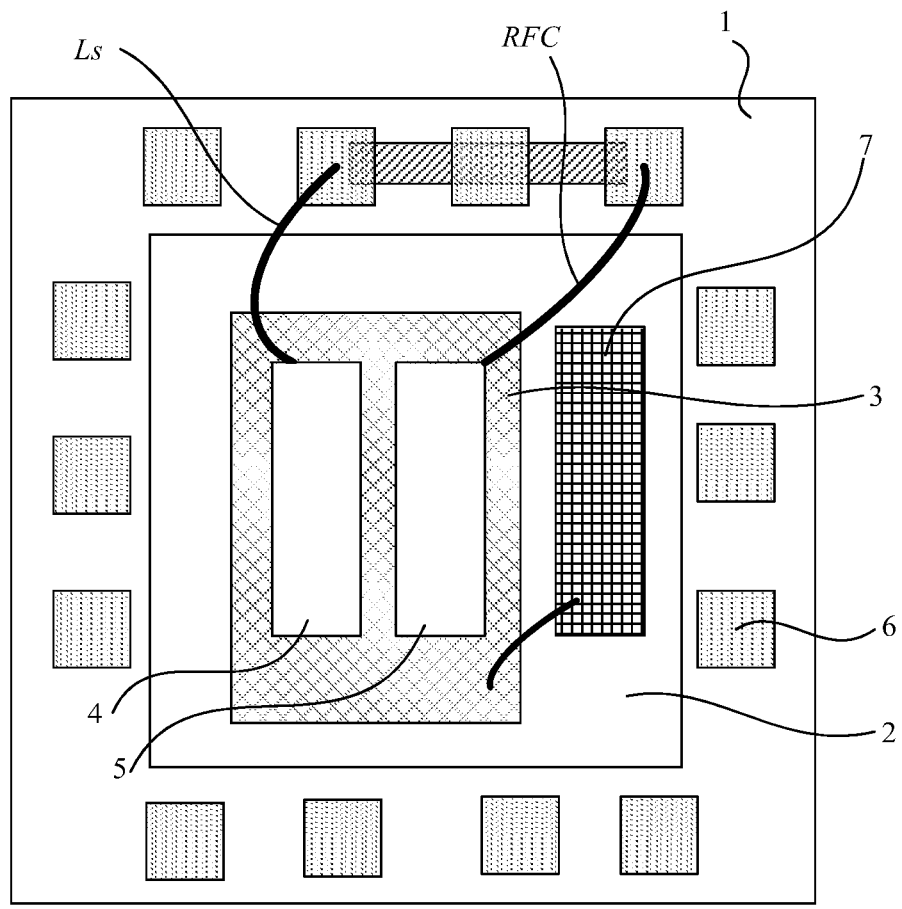
FIG. 2 is a schematic diagram of the structure of another integrated package electronic device provided by an embodiment of the present disclosure.

The matching circuit module 5 and the grounding circuit module 4 may be electrically connected to the same pad 6 at the same time, or may be electrically connected to different pads 6. As shown in FIG. 2, when the matching circuit module 5 and the grounding circuit module 4 are electrically connected to different pads 6, the two pads must be electrically connected, and there are no restrictions on the position and form of the electrical connection, so as to ensure that the other end of the radio frequency choke RFC connected to the matching circuit module 5 and the other end of the resonant inductor Ls connected to the grounding circuit module 4 are electrically connected. In this case, the merge point of the matching circuit module 5 and the grounding circuit module 4 is also formed in the packaging frame 1. It should be noted that FIGS. 1 and 2 only exemplarily show the connection mode of the matching circuit module 5 and the grounding circuit module 4 connecting with a part of the pads 6 on a certain side of the packaging frame 1, and the specific areas where the pads 6 of the packaging frame 1 electrically connected to the matching circuit module 5 and the grounding circuit module 4 are located are not limited in the embodiment of the present disclosure.

The electrical connection may be achieved by arranging metal bonding wires or microstrip wires between the pad 6 and the matching circuit module 5 as well as the grounding circuit module 4 to realize the functions of the radio frequency choke RFC and the resonant inductor Ls, respectively, where the number, length, and height of the bonding wires or microstrip wires may be adjusted according to the frequency etc. of the actual circuit, it is ensured that the inductance value of the radio frequency choke RFC is greater than the inductance value of the resonant inductor Ls. In this embodiment, the inductance value of the radio frequency choke RFC is greater than the inductance value of the resonant inductor Ls, which may make the grounding setting circuit is isolated from the AC signal and the DC bias signal can be passed, and prevent the signal of the matching circuit module from passing through the grounding circuit module.

One end of the matching circuit module 5 is electrically connected to the packaging frame 1 through a radio frequency choke RFC, and the other end is connected to a load circuit to achieve matching adjustment of the load impedance.

The device structure of this embodiment achieves the direct grounding function setting at the level of the integrated package electronic device, so as to avoid the problem of occupying a large area when the integrated electronic device is applied due to setting a long bias line on the printed circuit board and attaching a large capacitor to achieve the grounding function.

In the application of radio frequency circuits, this structure may be used for radio frequency integrated package electronic devices of power as amplifiers. As shown in FIG. 2 specifically, on one side of the packaging substrate 2 within the range of the packaging frame 1, i.e. on the same side where the integrated passive device area 3 is packaged, the active device area 7 is also packaged. The active device area 7 being electrically connected to the integrated passive device area 3. Exemplarily, the active device area 7 includes a power amplifier chip Die, for amplifying the input signal and outputting it and converting DC energy into radio frequency energy. The power amplifier chip Die may include gallium nitride GaN, gallium arsenide GaAs high electron mobility transistors, LDMOS, GeSi, and other semiconductor chips. An electrical connection is formed between the active device area 7 and the integrated passive device area 3; specifically, the active device area 7 is electrically connected to the matching circuit module 5, and a stable operating voltage is input to the active device area 3 through the matching circuit module 5 of the integrated passive device area 3; furthermore, the matching circuit module 5 may also match the load impedance of the load circuit to the output impedance of the active device area 3. For instance, the power amplifier chip Die obtains a gate bias voltage through the integrated passive device area 3 during actual work, and the matching circuit module 5 provides a drain bias circuit for the power amplifier chip Die. It is also possible to match the load impedance to the output impedance for the power amplifier chip Die through the matching circuit module 5 to ensure that the power amplifier Die has better power amplifier power, efficiency, and linearity characteristics. The package device structure significantly reduces the size of the current power amplifier module and improves the integration level of the power amplifier application circuit.

Figure 3:
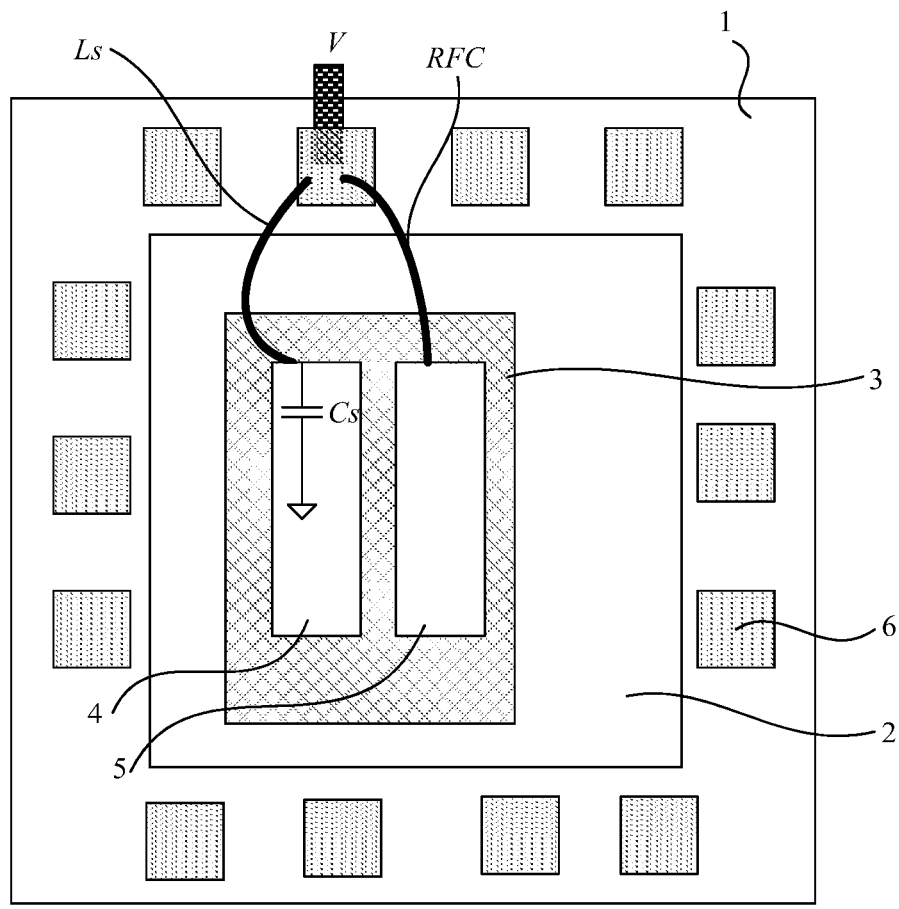
FIG. 3 is a schematic diagram of the structure of another integrated package electronic device provided by an embodiment of the present disclosure.

In a performing form, as shown in FIG. 3, one end of the grounding circuit 4 is electrically connected to the resonant inductor Ls, and the other end is electrically connected to a fixed voltage terminal. Exemplarily, the grounding circuit module 4 includes an integrated capacitor Cs, one end of the grounding circuit module 4 is connected to the resonant inductor Ls, and the other end of the grounding circuit module 4 is at equal potential with the packaging substrate 2. In this embodiment, one end of the integrated capacitor Cs is electrically connected to the resonant inductor Ls, and the other end is at equal potential with the packaging substrate 2, for example, the packaging substrate 2 is connected with the grounding potential. In this embodiment, one end of the integrated capacitor Cs and one end of the resonant inductor Ls are electrically connected and form a series resonant circuit, while the other end of the resonant inductor Ls is electrically connected to the pad 6 and at the same time is connected to a fixed voltage V to achieve the signal grounding function setting at the device structure level, and the series resonant circuit resonates at the circuit operating frequency $f_0$.

In the series resonant circuit, the inductance value of the resonant inductor Ls is Ls, the capacitance value of the integrated capacitor Cs is Cs, and the resonant frequency through the series resonant circuit is $f_0$. According to the working conditions of the series resonant circuit, the resonant frequency $f_0$ satisfies:

$$2j\pi f_0 L_s + \frac{1}{2j\pi f_0 C_s} = 0$$

That is, the resonant frequency of the series resonant circuit that achieves the signal grounding function setting in this embodiment is $$f_0 = \frac{1}{2\pi\sqrt{L_s C_s}}.$$

As shown in FIG. 3, the pad 6 electrically connected to the resonant inductor Ls is not only connected to the fixed voltage V, but also electrically connected to the pad 6 connected to the radio frequency choke RFC at the same time, to realize that the matching circuit module 5 and the grounding circuit module 4 have the same stable voltage outside the integrated passive device area 3 at the same time. In addition, when an active device chip is packaged within the integrated package electronic device structure, the active device chip is electrically connected to the integrated passive device area 3 within the package structure, to realize that the integrated passive device area 3 is used within the integrated package electronic device to provide a working bias voltage for the active device chip.

Due to the high cost of integrated passive devices at present, the cost of the integrated package electronic device is also high. Therefore, how to tune the circuit within the integrated package device according to requirements of different frequencies at the package device level to match different active device operating frequencies has become a further problem to be solved by the integrated package structure.

Figure 4:
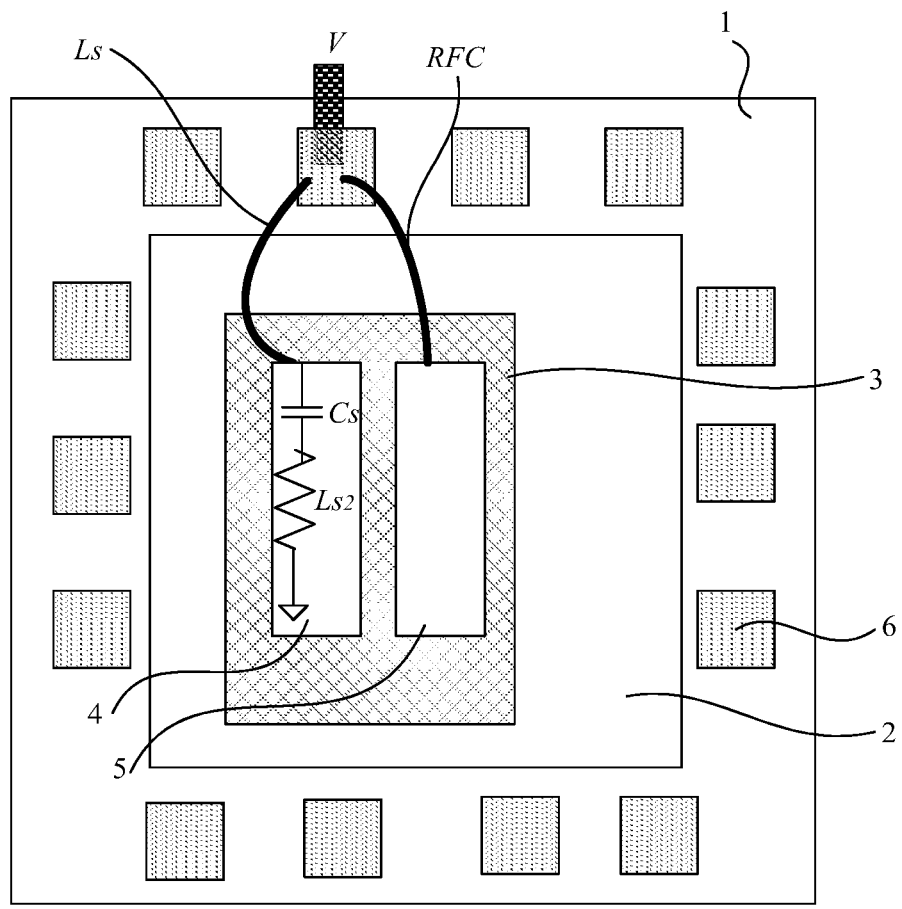
FIG. 4 is a schematic diagram of the structure of another integrated package electronic device provided by an embodiment of the present disclosure.

In another performing form, as shown in FIG. 4, the grounding circuit module 4 includes an integrated capacitor Cs and a tuning inductor Ls2. In this embodiment, the integrated capacitor Cs and the tuning inductor Ls2 are connected in series, which means, one end of the integrated capacitor Cs is electrically connected to the resonant inductor Ls, and the other end is electrically connected to one end of the tuning inductor Ls2, while the other end of the tuning inductor Ls2 is at equal potential with the packaging substrate 2, for example, the packaging substrate 2 is connected with the grounding potential, so the other end of the tuning inductor Ls2 is grounded. An inductor is respectively connected to both ends of the integrated capacitor Cs of the grounding circuit, especially the tuning inductor Ls2 is connected between the integrated capacitor Cs and the ground terminal, which can not only reduce the capacitance of the entire grounding circuit, but also realize the modification and tuning of the grounding circuit, and can realize the repeated use of the integrated package electronic device in a certain frequency range, increase the adjustment flexibility of the integrated circuit, and significantly reduce the cost of current radio frequency circuit applications. In this embodiment, one end of the integrated capacitor Cs is electrically connected to one end of the resonant inductor Ls, while the other end of the integrated capacitor Cs is electrically connected to one end of the tuning inductor Ls2, and the integrated capacitor Cs, the tuning inductor Ls2, and the resonant inductor Ls form a series resonant circuit, the other end of the resonant inductor Ls is electrically connected to the pad 6 and at the same time connected to a fixed voltage V, and the other end of the tuning inductor Ls2 is grounded to achieve the signal grounding function setting at the device structure level, and the series resonance circuit resonates at the frequency $f_0$.

In the series resonant circuit, the inductance value of the resonant inductor Ls is Ls, the capacitance value of the integrated capacitor Cs is Cs, the inductance value of the tuning inductor Ls2 is Ls2, and the resonant frequency of the series resonant circuit is $f_0$. According to the working conditions of the series resonant circuit, the resonant frequency $f_0$ satisfies:

$$(2j\pi f_0 L_{s2} + 2j\pi f_0 L_s) + \frac{1}{2j\pi f_0 C_s} = 0$$

That is, in this embodiment, the resonant frequency of the series resonant circuit in which the tuning inductance Ls2 is added to realize the signal grounding function setting is $$f_0 = \frac{1}{2\pi\sqrt{(L_s + L_{s2})C_s}}.$$

In this embodiment, the circuit adjustment flexibility of the package device structure is achieved by setting the integrated capacitor Cs and the tuning inductor Ls2 within the grounding circuit module, and the integrated capacitor Cs, the tuning inductor Ls2, and the resonant inductance Ls form a series resonant circuit, which allows the grounding circuit to be tuned according to requirements of different frequencies, increasing the adjustment flexibility of the integrated circuit, improving the utilization rate of the integrated device, and reducing the development time and costs.

In the present disclosure, the packaging component may be set as a QFN (Quad Flat No-lead package) packaging component, which is one of the surface mount packages, the QFN package is a leadless package, and the QFN packaging component is square or rectangular. A large exposed pad is provided at the bottom center of the packaging component for heat conduction, and conductive pads for achieving electrical connection are provided around the periphery of the large pad, which means the pad 6 mentioned in the above-mentioned embodiment. It is also possible to set the packaging component as a DFN (Dual Flat No-lead package) packaging component, which differs from the QFN packaging component in that the DFN packaging component is only provided with conductive pads for electrical connection on both sides of the packaging component, and the packaging component may also adopt other packaging forms, which is not limited in the embodiments of the present disclosure.

It should be noted that the accompanying drawings of the embodiments of the present disclosure are only exemplary representations of areas and respective elements, and do not represent actual sizes of the respective elements in the integrated package electronic device structure.

In the integrated package electronic device provided by embodiments of the present disclosure, by packaging the integrated passive device area including the matching circuit module and the grounding circuit module within the packaging component, the matching circuit module and the grounding circuit module being electrically connected to the packaging frame at the same time, and by connecting the radio frequency choke RFC and the resonant inductor Ls respectively to the same external voltage, the other end of the grounding circuit module is at equal potential with the packaging substrate, and the direct grounding function setting is achieved on the integrated package electronic device, thus avoiding the problem of occupying a large area when the integrated electronic device is applied, which is caused by setting a longer bias line on the printed circuit board and attaching a larger capacitor to achieve the grounding function. Furthermore, by setting the integrated capacitor Cs and the tuning inductor Ls2 within the grounding circuit module, the integrated capacitor Cs of the grounding circuit is connected to an inductor at each of both ends to achieve the circuit adjustment flexibility of the package device structure, which allows the grounding circuit to be tuned according to requirements of different frequencies, improving the utilization rate of the integrated device, and reducing the development time and costs.

It should be noted that, the above is only example embodiments and technical principles of the present disclosure. It should be appreciated by those skilled in the art that the present disclosure is not limited to specific embodiments described herein, and various obvious changes, readjustments, combinations, and alternatives can be made by those skilled in the art without departing from the protection scope of the present disclosure. Therefore, although the present disclosure has been described in detail by way of the embodiments above, the present disclosure is not limited to the embodiments above, and many other equivalent embodiments may be included without departing from the concept of the present disclosure. The scope of the present disclosure is determined by the scope of the appended claims.

What is claimed is:

1. An integrated package electronic device structure comprising:
   a packaging component comprising a packaging frame and a packaging substrate;
   at least two circuit modules packaged on one side of the packaging substrate within the packaging frame;
   wherein the packaging frame comprises a merge point for the at least two circuit modules;
   an integrated passive device area packaged on one side of the packaging substrate within the packaging frame;
   wherein the at least two circuit modules are located in the integrated passive device area;
   at least two connection circuits are formed between the integrated passive device area and the packaging frame; and
   wherein the at least two circuit modules comprise a matching circuit module and a grounding circuit module, wherein the matching circuit module and the grounding circuit module are electrically connected to the packaging frame, respectively, wherein one end of the grounding circuit module is electrically connected to the packaging frame via a resonant inductor Ls, and wherein one end of the matching circuit module is electrically connected to the packaging frame via an radio frequency choke RFC.

2. The integrated package electronic device structure according to claim 1, wherein the grounding circuit module comprises an integrated capacitor Cs, and wherein the integrated capacitor Cs and the resonant inductor Ls are electrically connected and form a series resonant circuit.

3. The integrated package electronic device structure according to claim 2, wherein the other end of the grounding circuit module is at equal potential with the packaging substrate.

4. The integrated package electronic device structure according to claim 3, wherein the grounding circuit module further comprises a tuning inductor Ls2, wherein the tuning inductor Ls2 is connected in series with the integrated capacitor Cs, and wherein the integrated capacitor Cs, the tuning inductor Ls2, and the resonant inductor Ls form a series resonant circuit.

5. The integrated package electronic device structure according to claim 1, wherein an inductance value of the radio frequency choke RFC is greater than an inductance value of the resonant inductor Ls.

6. The integrated package electronic device structure according to claim 1, further comprising an active device area packaged within the packaging frame, the active device area electrically connected to the integrated passive device area.

7. The integrated package electronic device structure according to claim 1, wherein the other end of the matching circuit module is connected to a load circuit.

8. The integrated package electronic device structure according to claim 1, wherein the packaging frame comprises at least one pad, wherein the matching circuit module and the grounding circuit module are electrically connected to the pads, respectively, and wherein the pad electrically connected to the matching circuit module and the pad electrically connected to the grounding circuit module are connected to the same fixed voltage.

9. The integrated package electronic device structure according to claim 8, wherein the other end of the radio frequency choke RFC electrically connected to the matching circuit module and the other end of the resonant inductor Ls electrically connected to the grounding circuit module are electrically connected.

* * * * *